United States Patent
Tsai et al.

(10) Patent No.: US 9,074,734 B2
(45) Date of Patent: Jul. 7, 2015

(54) LIGHT EMITTING DIODE (LED) LIGHT SOURCE DEVICE HAVING UNIFORM ILLUMINATION

(71) Applicant: ADVANCED OPTOELECTRONIC TECHNOLOGY, INC., Hsinchu Hsien (TW)

(72) Inventors: Ming-Ta Tsai, Hsinchu (TW); Ching-Chung Chen, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 13/951,364

(22) Filed: Jul. 25, 2013

(65) Prior Publication Data

US 2014/0151722 A1 Jun. 5, 2014

(30) Foreign Application Priority Data

Dec. 4, 2012 (CN) .......................... 2012 1 0512047

(51) Int. Cl.
*H01L 33/00* (2010.01)
*F21K 99/00* (2010.01)
*H01L 25/075* (2006.01)

(52) U.S. Cl.
CPC ............... *F21K 9/00* (2013.01); *H01L 25/0753* (2013.01)

(58) Field of Classification Search
CPC ...... H01L 25/0753; H01L 27/156; F21K 9/00
USPC ............................................................ 257/88
See application file for complete search history.

(56) References Cited

U.S. PATENT DOCUMENTS

| 2009/0050907 A1* | 2/2009 | Yuan et al. ...................... 257/88 |
| 2011/0305021 A1* | 12/2011 | Xin ............................ 362/249.02 |
| 2012/0300431 A1* | 11/2012 | You et al. .......................... 362/84 |

FOREIGN PATENT DOCUMENTS

| CN | 101581420 A | 11/2009 |
| CN | 202546491 U | 11/2012 |

* cited by examiner

*Primary Examiner* — Thien F Tran
(74) *Attorney, Agent, or Firm* — Novak Druce Connolly Bove + Quigg LLP

(57) ABSTRACT

An LED light source device includes a printed circuit board (PCB) and a plurality of LED light sources located on the PCB and electrically connected with the PCB. The plurality of LED light sources are arranged symmetrically relative to a center point of the PCB, and a distance between every adjacent two LED light sources decreases along a direction away from the center point of the PCB. An optical lens is located over the LED light sources for diverging light from a central one of the LED light sources.

4 Claims, 3 Drawing Sheets

LIGHT EMITTING DIODE (LED) LIGHT SOURCE DEVICE HAVING UNIFORM ILLUMINATION

BACKGROUND

1. Technical Field

The present disclosure relates to illumination devices, and more particularly to an LED (light emitting diode) light source device having a uniform distribution of light output.

2. Description of Related Art

LEDs have been widely promoted as light sources of electronic devices owing to many advantages, such as high luminosity, low operational voltage and low power consumption. However, a traditional LED light source device commonly includes a plurality of LED chips. As point light sources, when the plurality of LED chips are located on the PCB (print circuit board), the light intensity at the middle of the PCB is stronger than that of the peripheral of the PCB, whereby causes the light field of the LED light source device to be not uniform.

Therefore, an LED light source device which is capable of overcoming the above described shortcomings is desired.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
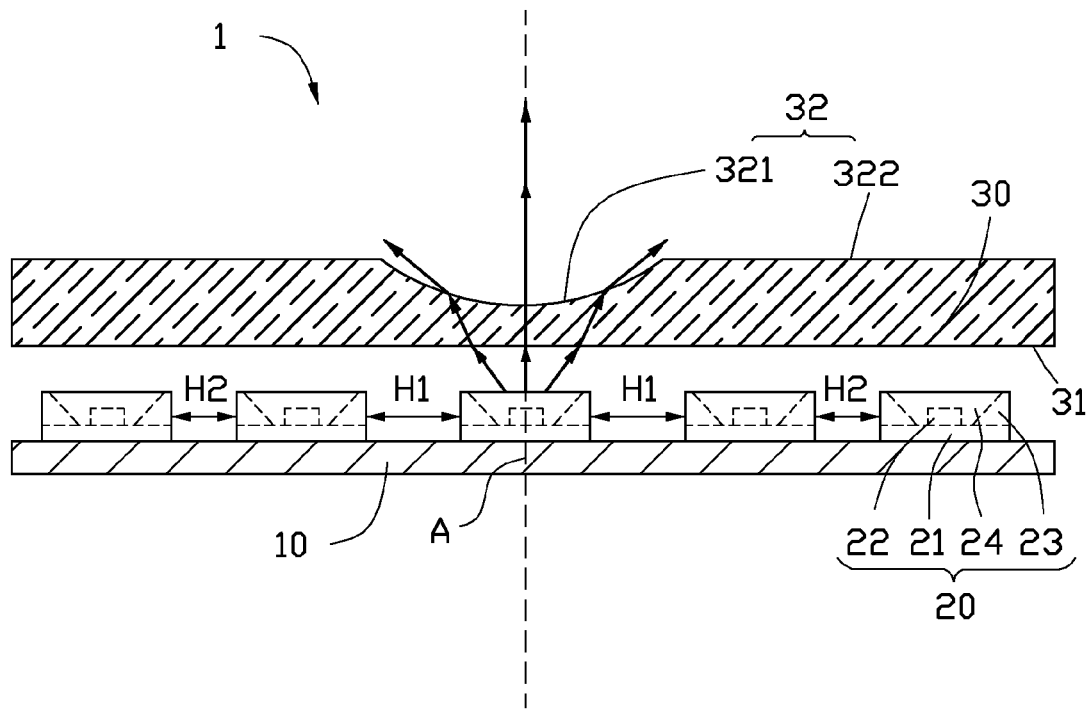
FIG. 1 shows a schematic view of an LED light source device in accordance with a first embodiment of the present disclosure.

Referring to FIG. 1, an LED light source device 1 in accordance with a first embodiment of the present disclosure includes a print circuit board (PCB) 10, a plurality of LED light sources 20 located on the PCB 10 and an optical component 30 positioned above the plurality of LED light sources 20.

The PCB 10 is an elongated plate, and defines a center point A at a center thereof.

The plurality of LED light sources 20 are mounted on the PCB 10 and electrically connected to the PCB 10. In this embodiment, the plurality of LED light sources 20 are arranged symmetrically on the PCB 10 relative to the center point A of the PCB 10, wherein a center of one LED light source 20 is positioned at the center point A of the PCB 10. The plurality of LED light sources 20 are spaced from each other, and a distance between every adjacent two LED light sources 20 is not uniform. The distance between the LED light source 20 located at the center point A of the PCB 10 and an adjacent LED light source 20 is greater than the distance between the adjacent LED light source 20 and a further distant (adjacent) LED light source 20. In other words, the distance between two adjacent LED light sources 20 gradually decreases along a direction away from the center point A. In this embodiment, there are five LED light sources 20. The distance between the LED light source 20 located at the center point A of the PCB 10 and the adjacent LED light source 20 is defined as $H_1$, and the distance between the adjacent LED light source 20 and the next adjacent LED light source 20 is defined as $H_2$. $H_1$ and $H_2$ meet the following relationship: $H_1 > H_2$. Preferably, $H_1 > H_2$ and $H_1 \geq H_2^3$. Thus, the density of the LED light sources 20 at the center of the PCB 10 is less than that at a peripheral region of the PCB 10, thereby to balance the light intensity of the center and the peripheral region of the PCB 10, further to cause the light distribution of the plurality of LED light sources 20 of the LED light source device 1 to be more uniform.

The LED light source 20 is an LED package, and includes a substrate 21, an LED chip 22 located on the substrate 21, a reflection cup 23 surrounding the LED chip 22, and an encapsulation layer 24 sealing the LED chip 22. The LED chip 22 is electrically connected to the PCB 10.

The optical component 30 includes a bottom surface 31 and a top surface 32 opposite to the bottom surface 31. The bottom surface 31 is flat, and parallel to the PCB 10. The top surface 32 has a middle portion 321 and a peripheral portion 322 surrounding the middle portion 321. The middle portion 321 is located corresponding to the center point A of the PCB 10. The middle portion 321 of the top surface 32 is concaved downwardly to define a concave surface; that is to say, a middle of the optical component 30 is acted as a concave lens. The peripheral portion 322 of the top surface 32 is parallel to the bottom surface 31. Light emitted from the LED light source 10 at the center point A of the PCB 10 travels towards the bottom surface 31 of the optical component 30 and then is refracted to an interior of the optical component 30, and then the light is refracted by the middle portion 321 again to exit outside. Thus, the optical component 30 can make the light intensity of the center and the peripheral region of the PCB 10 be balanced, to thereby further cause the light illumination of the plurality of LED light sources 20 of the LED light source device 1 to be more uniform.

Understandably, the middle of the optical component 30 can be other diverging lens.

In use, for the distance between every adjacent two LED light sources 20 decreasing along the direction away from the center point A, and an optical component 30 which can make light diverge being located above the center point A of the PCB 10, it makes the light intensity of the center and the peripheral of the PCB 10 balanceable, thereby to cause the light illumination of the plurality of LED light sources 20 of the LED light source device 1 to be more uniform.

Figure 2:
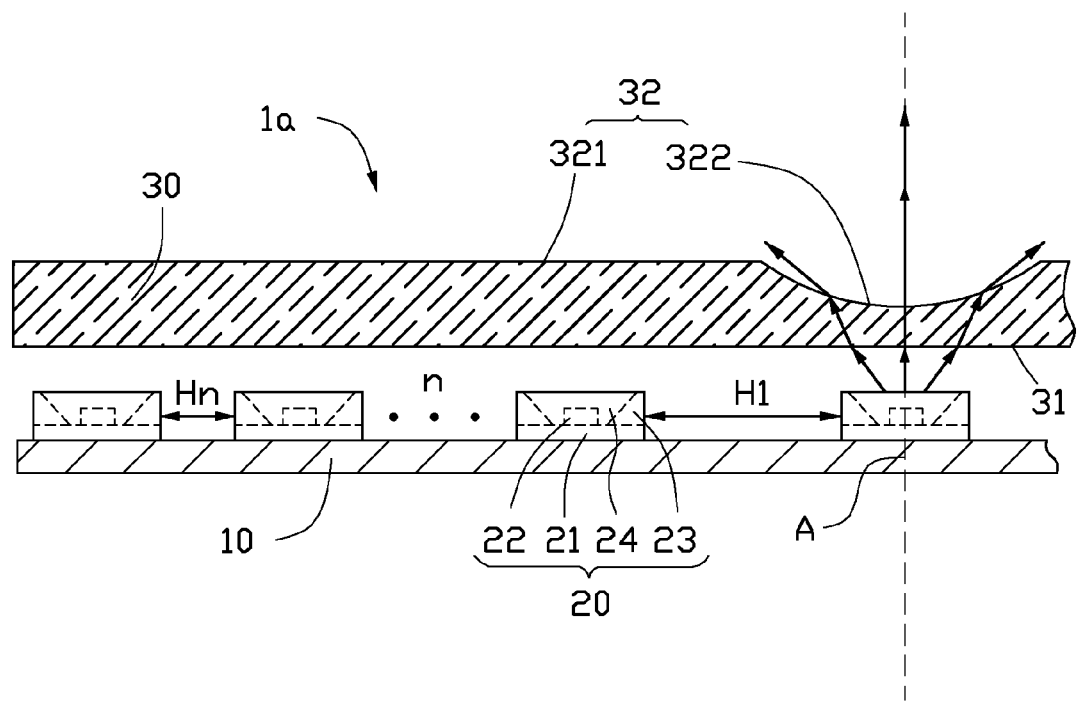
FIG. 2 shows a schematic view of part of an LED light source device in accordance with a second embodiment of the present disclosure.

Referring to FIG. 2, it shows a schematic view of a half of an LED light source device 1a in accordance with a second embodiment of the present disclosure. The LED light source device 1a has a centrosymmetric structure. The LED light source device 1a is similar to the LED light source device 1 of the first embodiment, and the difference is: a number of the LED light sources 20 located at one side of the center point A is n, wherein n is larger than two and the distance between the first LED light source 20 located at the center point A of the PCB 10 and an adjacent second LED light source 20 is defined as $H_1$, the distance between the second LED light source 20 and an adjacent third LED light source 20 is defined as $H_2$, and so forth, the distance between the outmost LED light source 20 and an adjacent LED light source 20 is $H_n$. $H_1$, $H_2$, ... $H_n$ meet the following relationship: $H_1 > H_2 > H_3 \ldots > H_n$. Preferably, $H_1 > H_2 > H_3 \ldots > H_n$, and $H_1 \geq H_2^2 \geq H_3^4 \ldots \geq H_n^{2^{n-1}}$, and n is an integer greater than 2.

Figure 3:
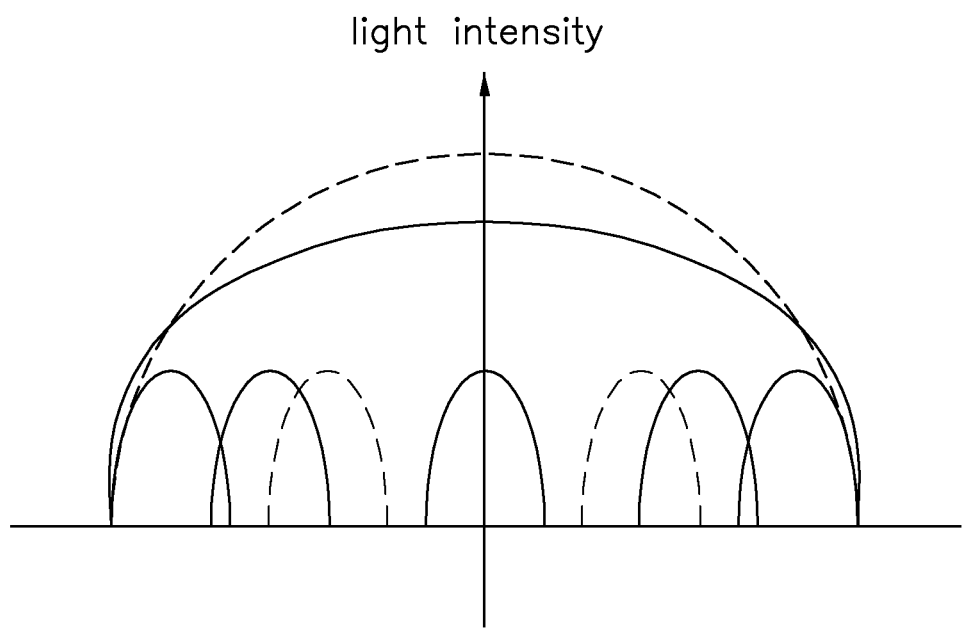
FIG. 3 is a diagram showing a comparison of light intensity distribution between the LED light source device of FIG. 1 and a traditional LED light source device.

Referring to FIG. 3, it is a diagram showing a comparison of light intensity distribution between the LED light source device 1 of FIG. 1 and a traditional LED light source device. The LED light source device 1 and the traditional LED light source device both include five LED light sources. In the traditional LED light source device, the five LED light sources are arranged equidistantly from each other. In the LED light source device 1, $H_1$, $H_2$ meet the following relationship: $H_1 > H_2$, and $H_1 \geq H_2^2$. In this embodiment, $H_1 = 10$ millimeters, $H_2 = 3$ millimeters. The dotted lines show the light intensity distribution of the traditional LED light source device, and the solid lines show the light intensity distribution of the LED light source device 1. It can be seen from FIG. 3 that the light illumination of the LED light source device 1 according to the present disclosure is more uniform than the traditional LED light source device.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. An LED (light emitting diode) light source device, comprising:

a PCB (printed circuit board);

a plurality of LED light sources located on the PCB and electrically connected to the PCB, wherein the plurality of LED light sources are arranged symmetrically relative to a center point of the PCB, and a distance between every adjacent two LED light sources decreases along a direction away from the center point of the PCB, wherein a center of a first LED light source is positioned at the center point of the PCB;

an optical component located on light output paths of the plurality of LED light sources, a middle portion of the optical component is located corresponding to the center point of the PCB, the middle portion diverging light from the first LED light source whose center is located at the center point of the PCB, wherein the optical component comprises a bottom surface and a top surface, the bottom surface is flat, the top surface has a middle portion and a peripheral portion surrounding the middle portion, the middle portion is located corresponding to the center point of the PCB, the middle portion of the top surface is concaved downwardly to define a concave surface, and the peripheral portion of the top surface is parallel to the bottom surface, wherein a distance between the first LED light source located at the center position of the PCB and an adjacent second LED light source is defined as $H_1$, a distance between the second LED light source and an adjacent third LED light source is defined as $H_2$, and so forth, a distance between the outside LED light source and an adjacent LED light source is $H_n$, and $H_1, H_2, \ldots H_n$ meet the following relationship: $H_1 \geq H_2 > \ldots > H_n$, and n is an integer greater than 1, wherein $H_1 \geq H_2^2 \geq \ldots \geq H_n^{2^{n-1}}$, and n is an integer greater than 1.

2. The LED light source device of claim 1, wherein the LED light source is an LED package, and comprises a substrate, an LED chip located on the substrate, a reflection cup surrounding the LED chip, and an encapsulation layer sealing the LED chip, the LED chip is electrically connected with the PCB.

3. An LED light source device, comprising:

a PCB defining a center point;

a plurality of LED light sources located on the PCB and electrically connected to the PCB, at least one LED light source positioned at the center point of the PCB;

an optical component located on output paths of the plurality of LED light sources, a middle portion of the optical component being located corresponding to the center point of the PCB, the middle portion diverging light from the at least one LED light source;

wherein the plurality of LED light sources are arranged symmetrically on the PCB relative to the center point of the PCB, and a distance between every adjacent two LED light sources is decreasing along a direction away from the center point of the PCB, a distance between the at least one LED light source located at the center point of the PCB and an adjacent second LED light source is defined as $H_1$, a distance between the second LED light source and an adjacent third LED light source is defined as $H_2$, and so forth, a distance between the outmost LED light source and an adjacent LED light source is $H_n$, $H_1$, $H_2$, $\ldots H_n$, meet the following relationship: $H_1 > H_2 > \ldots > H_n$, and n is an integer greater than 1, wherein the optical component comprises a bottom surface and a top surface, the bottom surface is flat, the top surface has a middle portion and a peripheral portion surrounding the middle portion, the middle portion is located corresponding to the center point of the PCB, the middle portion of the top surface is concaved downwardly to define a concave surface, and the peripheral portion of the top surface is parallel to the bottom surface, wherein $H_1 \geq H_2^2 \geq \ldots \geq H_n^{2^{n-1}}$, and n is an integer greater than 1.

4. The LED light source device of claim 3, wherein the LED light source is an LED package, and comprises a substrate, an LED chip located on the substrate, a reflection cup surrounding the LED chip, and an encapsulation layer sealing the LED chip, the LED chip is electrically connected with the PCB.

* * * * *